(12) United States Patent
Bacchus (10) Patent No.: US 10,521,294 B2
(45) Date of Patent: Dec. 31, 2019

(54) PATROL SCRUB PERIODS BASED ON POWER STATUS

(71) Applicant: HEWLETT-PACKARD DEVELOPMENT COMPANY, L.P., Houston, TX (US)

(72) Inventor: Reza M Bacchus, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/563,094

(22) PCT Filed: Jun. 30, 2015

(86) PCT No.: PCT/US2015/038443
§ 371 (c)(1),
(2) Date: Sep. 29, 2017

(87) PCT Pub. No.: WO2017/003440
PCT Pub. Date: Jan. 5, 2017

(65) Prior Publication Data
US 2018/0173588 A1    Jun. 21, 2018

(51) Int. Cl.
*G06F 11/10* (2006.01)
*G06F 12/02* (2006.01)
*G11C 29/52* (2006.01)

(52) U.S. Cl.
CPC ........... *G06F 11/106* (2013.01); *G06F 12/02* (2013.01); *G11C 29/52* (2013.01)

(58) Field of Classification Search
CPC ...... G06F 12/02; G06F 11/106; G06F 11/004; G11C 29/52
See application file for complete search history.

(56) References Cited

U.S. PATENT DOCUMENTS

| 6,088,760 A * | 7/2000 | Walker | G06F 12/0893 711/104 |
| 8,639,964 B2 | 1/2014 | Berke et al. | |
| 8,898,408 B2 | 11/2014 | Berke et al. | |
| 2003/0191888 A1 | 10/2003 | Klein | |
| 2004/0243886 A1 | 12/2004 | Klein | |
| 2005/0028039 A1* | 2/2005 | Henderson | G06F 11/106 714/42 |
| 2007/0089032 A1* | 4/2007 | Alexander | G06F 11/1024 714/763 |
| 2008/0239851 A1* | 10/2008 | Lin | G11C 16/3418 365/222 |
| 2010/0005376 A1* | 1/2010 | LaBerge | G11C 29/808 714/819 |

(Continued)

FOREIGN PATENT DOCUMENTS

EP    1687720 B1    1/2008

OTHER PUBLICATIONS

"Super"; Jul. 29, 2014; 99 pages.
Agny, R. et al.; "The Intel® Itanium® Processor 9300 Series"; Feb. 4, 2010; 16 pages.

*Primary Examiner* — Guy J Lamarre
(74) *Attorney, Agent, or Firm* — HPI Patent Department (57) ABSTRACT

In one implementation, a memory module with on-die error correction code (ECC) with scrub operation capabilities and a programmable patrol scrub period is coupled to a memory controller that causes error correction operations to perform based on a power status of an energy storage device.

15 Claims, 4 Drawing Sheets

(56) References Cited

U.S. PATENT DOCUMENTS

| | | | |
|---|---|---|---|
| 2010/0329293 A1* | 12/2010 | Taubman | B82Y 20/00 |
| | | | 372/38.02 |
| 2011/0231697 A1* | 9/2011 | Berke | G06F 11/004 |
| | | | 714/3 |
| 2012/0284575 A1 | 11/2012 | Foley | |
| 2013/0191833 A1 | 7/2013 | Kotzur | |
| 2013/0290759 A1 | 10/2013 | Kumar et al. | |
| 2014/0075099 A1 | 3/2014 | Ooneda | |
| 2014/0211579 A1 | 7/2014 | Lovelace et al. | |
| 2015/0169398 A1 | 6/2015 | Chunn | |
| 2016/0054937 A1* | 2/2016 | Tuers | G11C 7/04 |
| | | | 711/103 |
| 2016/0099057 A1* | 4/2016 | Dusija | G11C 29/028 |
| | | | 365/185.12 |
| 2016/0224262 A1* | 8/2016 | Mandava | G11C 14/0009 |
| 2018/0067805 A1* | 3/2018 | Chinnakkonda Vidyapoornachary | |
| | | | G06F 11/106 |
| 2018/0165238 A1* | 6/2018 | Depew | G06F 13/122 |

\* cited by examiner

PATROL SCRUB PERIODS BASED ON POWER STATUS

BACKGROUND

Computers generally use storage devices, sometimes referred to as memory modules, to store data. Storage device may include volatile storage devices and non-volatile storage devices such as read-only memory (ROM) or random-access memory (RAM).

DETAILED DESCRIPTION

In the following description and figures, some example implementations of apparatus, systems, and/or methods for patrol scrubbing a memory module are described. Systems that use RAM such as dynamic RAM (DRAM), may experience erroneous values resulting from internal data corruption within the RAM. For example, storage capacitors within the DRAM die may lose their charge and cause a bit to change state. Another example is that stray alpha particles may cause a bit within the DRAM die to spontaneously change state. Error correction code (ECC) memory is a type of computer-readable storage medium that allows the detection and correction of errors within the memory. ECC memory may generally utilize additional storage locations for the ECC data.

An ECC DRAM module may generally include an extra memory chip dedicated for ECC operations such as error detection, error tracking, and scrubbing. A demand scrub on an ECC module is a demand read operation conducted by an ECC correction-aware memory controller, in which the memory controller detects an error and writes the corrected data back into the module. The demand read operation is usually initiated by a processor resource. A patrol scrub on an ECC memory module with a dedicated ECC memory chip may comprise an example method of a correction-aware memory controller to prevent the accumulation of bad bits in the ECC module. For example, the memory controller may sequentially read every addressable location, and, if the memory controller detects an error, the memory controller writes the corrected data back into the ECC module. A particular class of ECC memory modules is on-die ECC memory modules. An on-die ECC memory module may not include an extra memory chip dedicated to ECC operations; and on-die ECC memory modules may not be attached to a correction-aware memory controller. For example, each die on memory modules implemented with on-die ECC may have the ability to correct a single bad bit in a 64-bit burst of data during transmission of a demand read operation. In the on-die ECC example, the memory module may not have the ability to write back the corrected data into the storage location. In addition in the on-die ECC example, the memory controller may be a correction-transparent memory controller. As used herein, a correction-transparent memory controller is a controller that is unaware that the memory module transmitted corrected data from a location that contains bad data. For example, a correction-transparent memory controller does not write the corrected data back onto the on-die ECC module. Unchecked, this may, for example, result in an accumulation of bad data bits that may eventually combine to cause, for example, a catastrophic system error. To prevent this, a correction-transparent memory controller attached to a memory module with on-die ECC may issue a scrub command to every memory location (e.g., perform a patrol scrub routine as discussed herein). When the on-die ECC module detects the scrub command, the module may internally (e.g., on the memory module without assistance from the memory controller) read the addressed data, check for errors, correct the errors, and write the corrected data back into the original location, for example.

ECC memory modules generally are capable of allowing on-demand scrubbing and/or patrol scrubbing. Patrol scrubbing, as used herein, includes the operations of scrubbing the addressable locations of a memory module over a time period, herein referred to as a patrol scrub period. In general, the purpose of patrol scrubbing is to access every addressable location of the installed memory module within the patrol scrub period for errors. Patrol scrubbing may be a continuous operation or otherwise may, for example, utilize compute resources. Patrol scrubbing may have a negative impact on, for examples, memory throughput and power consumption. Some computer systems are battery-based or otherwise utilize an energy storage device to provide power to the computer system. Power may, for example, be a diminishing compute resource during operations occurring while using the energy storage device (e.g., discussed as discharging the energy storage device herein) and background operations, such as patrol scrubbing operations, may consume that resource at an undesired rate.

Various examples described below relate to programmably making the patrol scrub period based on the charge level of an energy storage device. By taking into account the power status of the energy storage device, the system and/or mobile compute device may, for example, be adaptive in power consumption incurred by the patrol scrub routines.

The terms "include," "have," and variations thereof, as used herein, mean the same as the term "comprise" or appropriate variation thereof. Furthermore, the term "based on," as used herein, means "based at least in part on." Thus, a feature that is described as based on some stimulus may be based only on the stimulus or a combination of stimuli including the stimulus. Furthermore, the term "maintain" (and variations thereof) as used herein means "to create, delete, add, remove, access, update, and/or modify."

Figure 1:
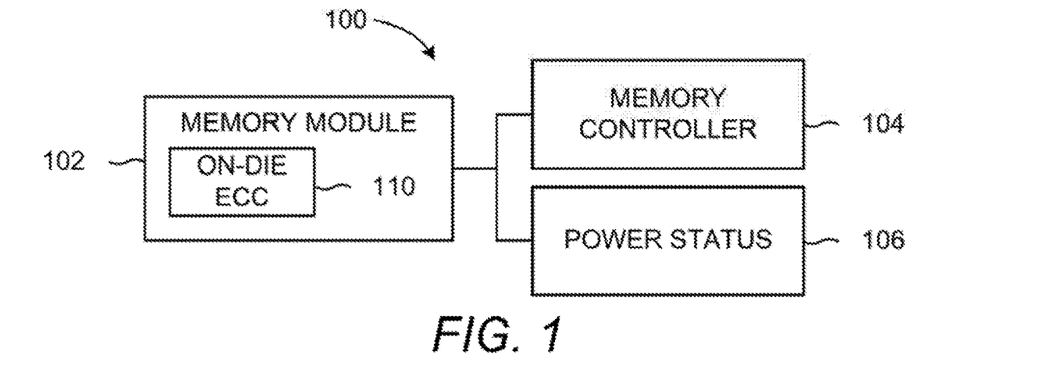
FIGS. 1 and 2 are block diagrams depicting example systems for patrol scrubbing a memory module.
Figure 2:
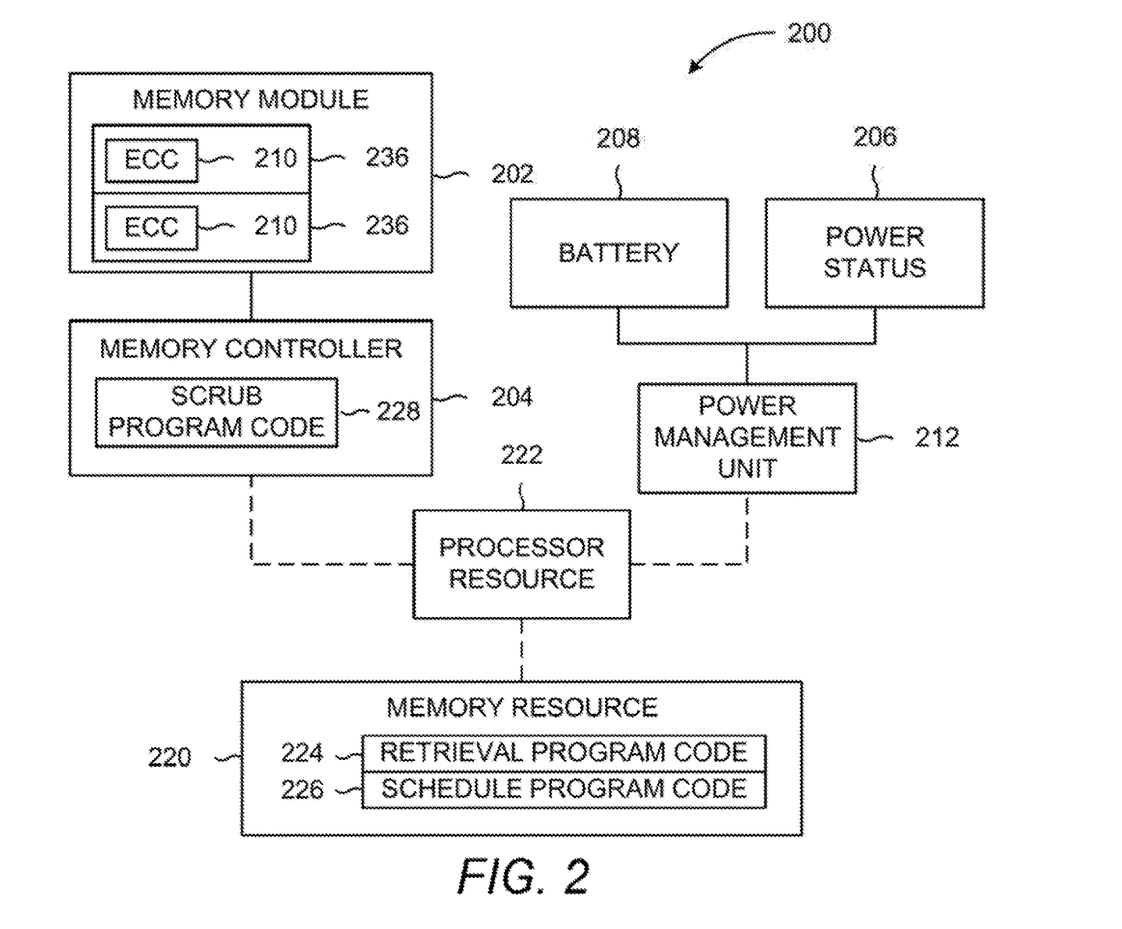

FIGS. 1 and 2 are block diagrams depicting example systems 100 and 200 for patrol scrubbing a memory module 102 and 202, respectively. Referring to FIG. 1, the example system 100 of FIG. 1 generally includes a memory module 102 with on-die ECC 110 and a memory controller 104. In general, the memory controller 104 may set a patrol scrub period of the memory module 104 based on a power status 106.

A memory module, such as memory module 102, as used herein, refers to a computer-readable storage device compatible within a compute device 100 having an energy storage device. Example memory modules include single data rate synchronous random-access memory (SDR SDRAM) and double data rate synchronous dynamic random-access memory (DDR SDRAM). Example compute devices having an energy storage device include devices that utilize power from a battery or a capacitor, such as a battery-based compute device, to function without being plugged into a continuous external power source. Example battery-based compute devices include mobile compute devices such as notebooks, tablets, and mobile phones.

Figure 3:
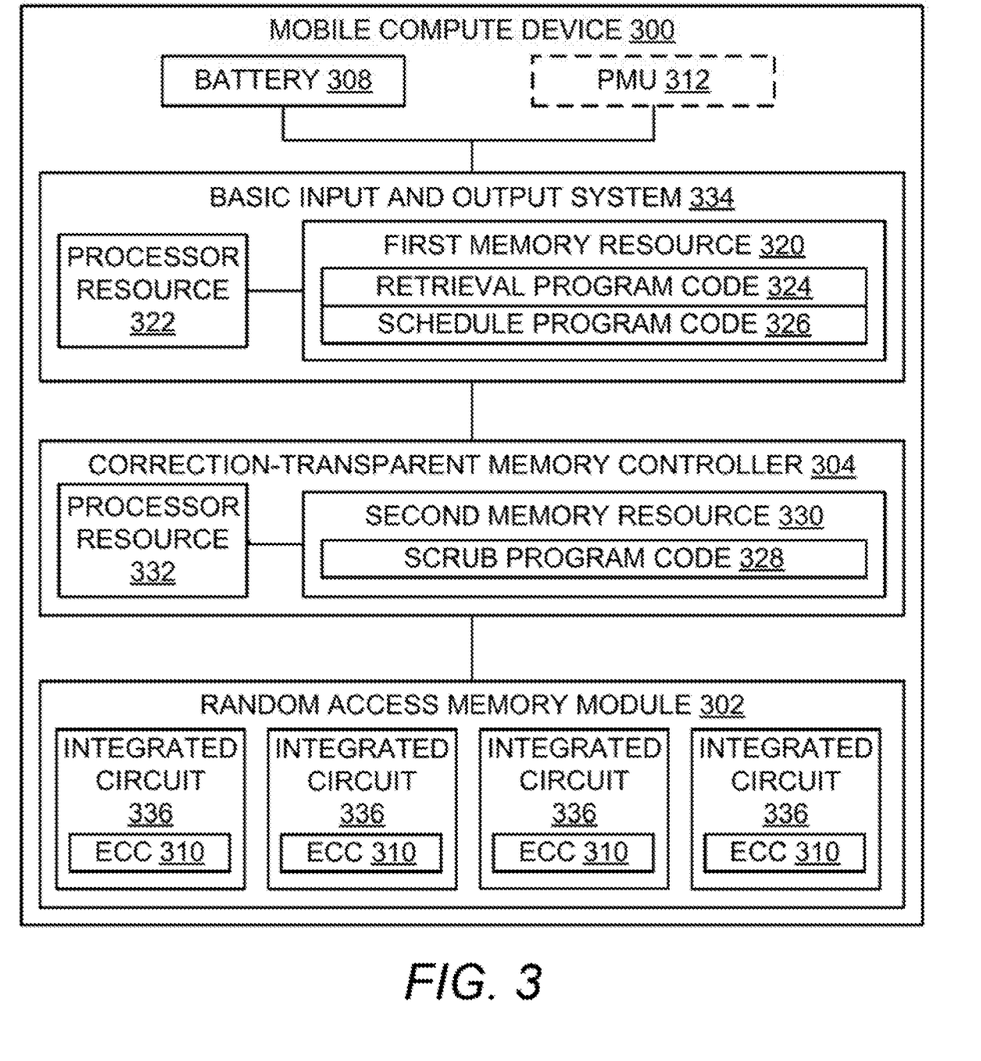
FIG. 3 is a block diagram depicting an example mobile compute device.

The memory modules 102, 202, and 302 depicted in FIGS. 1-3 and discussed herein refer to memory modules with on-die ECC capabilities rather than non-ECC memory modules. For example, the memory module 102 of FIG. 1 may comprise a DRAM with on-die error correction code (ECC). ECC memory modules with non-on-die ECC generally include an extra memory chip dedicated to performing the operations defined by the ECC. For example, a non-ECC DDR4 SDRAM that includes eight memory chips to provide a particular size of storage space would, to implement an ECC DDR4 SDRAM, include a ninth memory chip strictly for storage of the ECC code that allows on-demand scrubbing operations and/or patrol scrubbing operations. Error correction operations, as used herein, are the operations performable by the on-die ECC memory module during read operations, write operations, and patrol scrub operations. Memory modules with on-die ECC, as discussed herein, lack an ECC-dedicated memory chip. For example, as shown in FIGS. 2 and 3, each memory chip (i.e., integrated circuit for storing data) would comprise circuitry for data storage as well as additional storage locations for the ECC data. In this manner, the resources used by an ECC-dedicated memory chip in non-on-die ECC memory modules may be said to be distributed across the memory chips of an on-die ECC memory module to enable the performance of error correction operations.

The ECC, such as ECC 110 of FIG. 1, can be executed by a memory module to perform error correction operations. As discuss herein, the error correction operations include operations associated with patrol scrubbing techniques. For example, the memory controller may perform a scrub routine comprising error correction operations (e.g., in response to a parameter set by to a basic input and output system (BIOS) that makes a call to the memory controller to program the scrub period). For another example with on-die ECC, an error correction operation would include a scrub operation performed during a memory address read operation. In an example scrub operation, the data at a memory location is accessed and a determination as to whether there is a bit in error is made by executing the ECC on the memory module, then, if an error is detected, a corrected bit value is provided in lieu of the bit in error. A scrub operation, as used herein, comprises operations to scrub a memory location, such as reading from each computer memory location, detecting bit errors, and correcting bit errors (if any) with the ECC. A scrub operation is distinguishable from a read operation at the action of providing data. In a read operation, the corrected data is provided externally to the memory controller, while, in a scrub operation, the corrected data is provided to the memory location for storage. The scrub operation may be deemed an internal scrub operation with a modified write operation without external data which is distinct from a scrub operation from a correction-aware memory controller that may track and perform the scrub operation by receiving the corrected data at the memory controller and writing the corrected data back to the memory location on the memory module. For a further example, a scrub operation may comprise a read operation that causes a RAM module to maintain a correct value based on error correction operations defined by the ECC. In some example ECC. Implementations, the scrub operation may write the corrected data back to the same location. In an example on-die ECC implementation, the correct value is not written back to the memory location when the determination identifies an erroneous bit during a read operation.

Patrol scrubbing is performed with reference to a patrol scrub period (e.g., a time frame in which to scrub each addressable memory location of the memory module). By using a patrol scrub period, the memory module can operate on a schedule to, for example, each memory location is scrubbed at least once during the time period. As discussed herein, the patrol scrub period is programmable. For example, a BIOS may call a function to the memory controller, such as memory controller 104, to set the programmable patrol scrub period on the memory module, such as memory module 102 to a particular time frame, such as 12 hours, 24 hours, or 72 hours.

As discussed herein, the patrol scrub period is maintainable based on a power status, such as power status 106 of FIG. 1, of an energy storage device. For example, the power status 106 may identify whether a battery-based system is plugged into an external power source (e.g., charging) or discharging power from an energy storage device (e.g., operating on battery power) and the patrol scrub period may be set based on the power status 106. In that example, the patrol scrub period is set to a first time frame that is shorter than a second time frame when the power status 106 indicates the system 100 is plugged into an external power source and the patrol scrub period is set to the second time frame that is longer than the first time frame when the power status 106 indicates the system 100 is discharging power from the energy storage device. In another example, the power status 106 may indicate a level of charge of the energy storage device and the patrol scrub period may be set with an inversely proportional relationship with the level of charge. The power status may be automatically maintainable based on power events, such as power status changes identified by a power management unit (PMU), or otherwise maintainable by a BIOS program. As used herein, an energy storage device is any appropriate electronic device for storage of energy usable by a compute device, such as a battery, a capacitor, or a combination thereof. Example energy storage devices include lithium-ion batteries, nickel-cadmium batteries, nickel-metal hydride batteries, alkaline batteries, supercapacitors, ultracapacitors, and so forth.

The determined patrol scrub period is set via the memory controller, such as memory controller 104. For example, a BIOS operation may coordinate the setting of the programmable patrol scrub period by making a function call to the memory controller to set the patrol scrub period based on the power status. The memory controller may cause the error correction operations to perform during a scrub routine by setting the programmable patrol scrub period, which may cause the memory module to operate at a schedule based on the set patrol scrub period.

In an on-die ECC memory module, the memory controller may operate independent of any corrections performed by the on-die ECC. For example, the memory controller may be unaware of which memory locations of the memory module are corrected by the on-die ECC capabilities or any specific data corrections (e.g., which values changed) performed by the on-die ECC capabilities of the memory module. In such an example, the memory controller may be able to retrieve error correction statistics from the memory module, but may not be tracking the individual errors detected by the error correction operations performed by the memory module because the correction-unaware (i.e., correction-transparent) memory controller lacks an error tracking feature (e.g., circuitry or a combination of circuitry and executable instruction to track errors detected by the error correction operations). As discussed herein, an individual correction represents a correction made by a single scrub operation. Individual error data of an. Individual correction is distinct from statistical error data of multiple corrections, such as providing a number of errors occurred during a particular time frame. For example, the knowledge of the number of errors is not the same as the knowledge of which bit was erroneous during a particular scrub operation performed at a particular memory location. For another example, individual error data may include addresses of memory locations that incurred errors and statistical error data may not include any particular memory location information.

A memory controller, as used herein, is circuitry or a combination of circuitry and executable instructions to maintain the memory modules of a compute device. Circuitry, as used herein, may refer to individual, discrete electronic components or a combination of electronic components connected by conductive material. For example, a circuit may be constructed of discrete components connected by wire or a combination of components soldered to interconnects produced by a photolithographic technique on a laminated substrate. For another example, circuitry may comprise a semiconductor with operations logically implemented in the materials of the semiconductor. A controller, as used herein, includes circuitry or a combination of circuitry and executable instructions, such as a memory resource with executable instructions, a processor resource, and input/output functionality. For example, a controller may be a fully-operational system on a memory chip that consists of a computing unit (e.g., a microprocessor), programmable memory (e.g., electronic programmable read-only memory), working memory (e.g., a memory module, such as RAM), and input/output circuitry. A memory controller comprises a controller with the task of managing the memory modules of a compute device. For example, the memory controller may include logic programmed on silicon to perform the operations described herein with regards to performing a patrol scrub, such as programming a scrub period and causing a scrub operation to perform. The memory controllers 104, 204 and 304 of FIGS. 1-3 have a patrol scrub capabilities that are correction-unaware (e.g., have the ability to cause a memory module to perform a scrub operation at a memory location without knowledge as to whether there was an erroneous bit at the memory location). The patrol scrub capabilities of the memory controller may, for example, include maintaining a patrol scrub period, causing a scrub operation to perform by the memory module, and/or tracking the location in a sequential order for performing the scrub operations.

Figure 4:
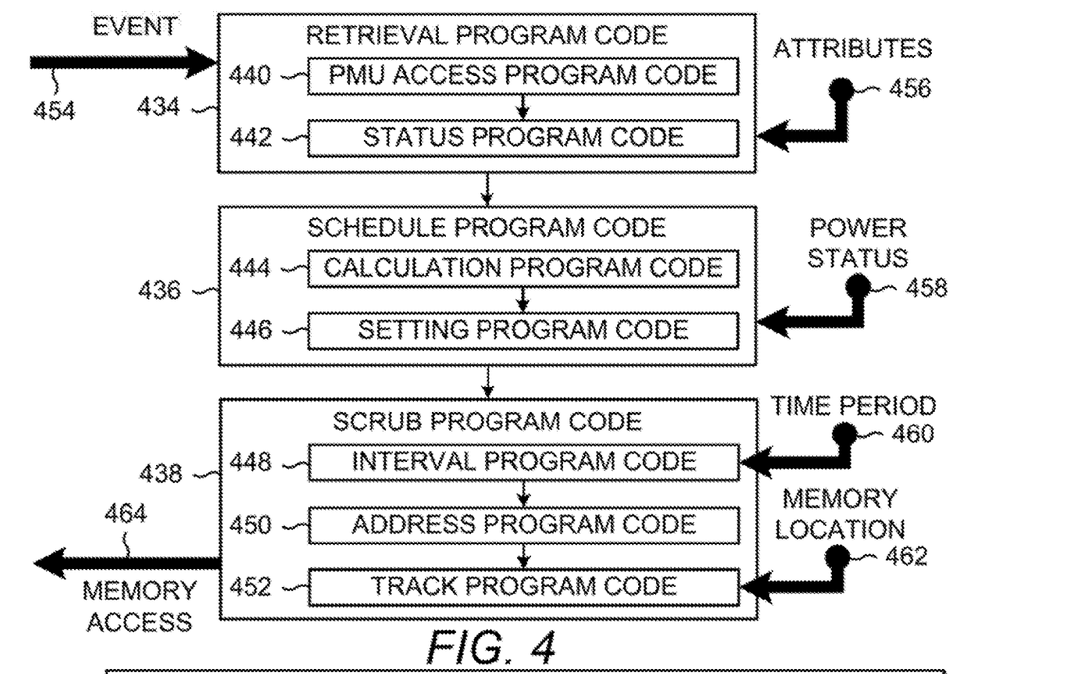
FIG. 4 depicts example operations used to implement example systems for patrol scrubbing a memory module.
Figure 5:
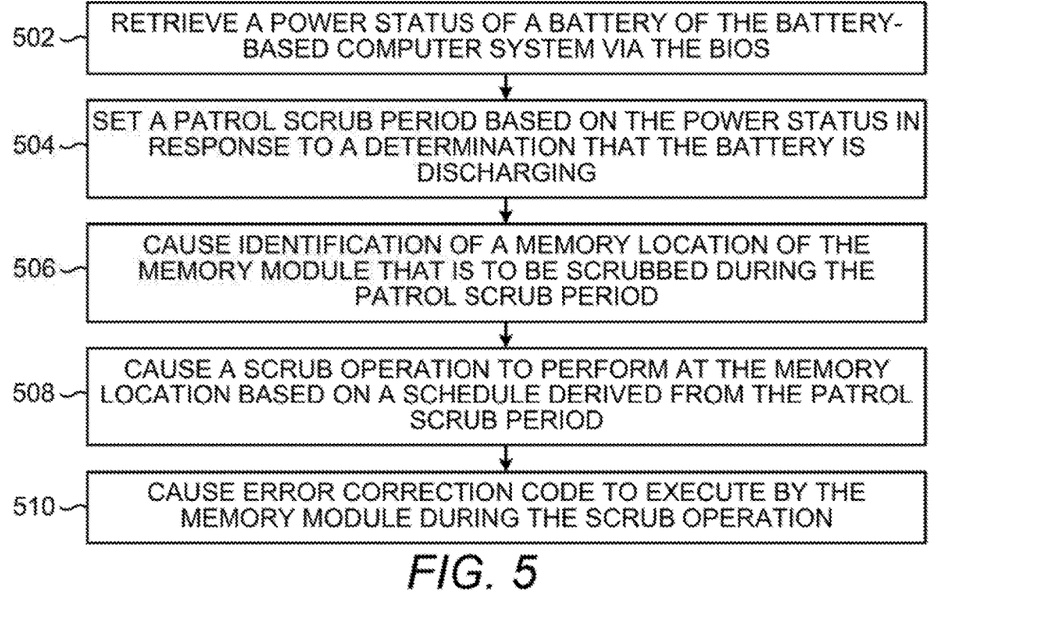
FIGS. 5 and 6 are flow diagrams depicting example methods for patrol scrubbing a memory module.
Figure 6:
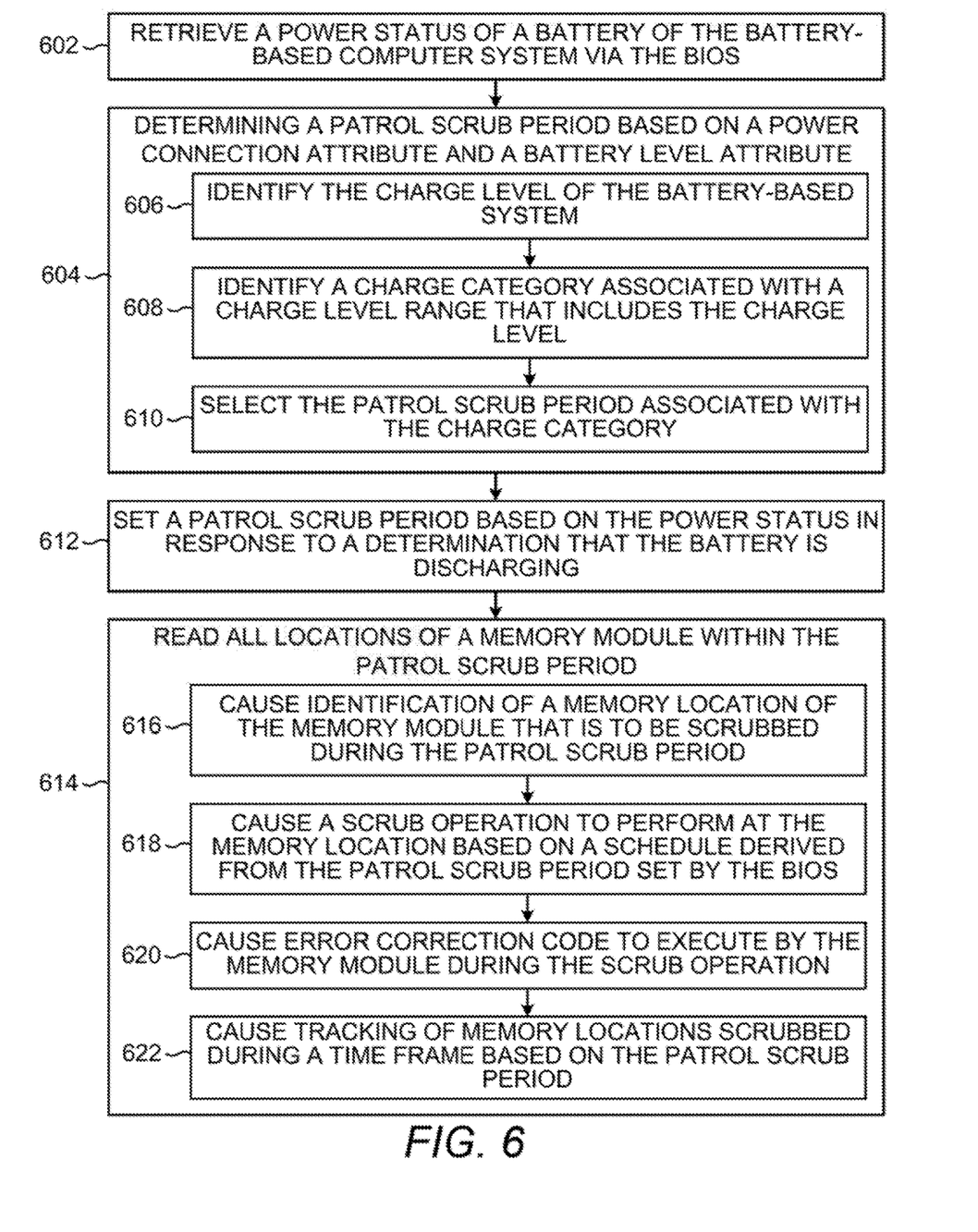

In some examples, functionalities described herein in relation to any of FIGS. 1-3 may be provided in combination with functionalities described herein in relation to any of FIGS. 4-6.

Referring to FIG. 2, the example system 200 for patrol scrubbing a memory module may include a memory module 202 and a memory controller 204 that are the same as memory module 102 and memory controller 104 and their associated descriptions have not been repeated in their entirety for brevity. The example system 200 also includes a battery 208, a power management unit (PMU) 212, a processor resource 222, and a memory resource 220.

As discussed above, the memory controller may comprise executable instructions and circuitry (e.g., a processor resource, such as processor resource 222 of FIG. 2) to perform operations to maintain a memory module. The memory controller 204, for example, may comprise scrub program code 228 that when executed causes an error correction operation, such as a scrub operation, to be performed by the memory module 202 based on the power status 206. For example, the memory controller 204 may comprise a correction-transparent memory controller (i.e., a memory controller that operates independent of knowledge of individual corrections performed by the ECC capabilities of the memory module) comprising a computer-readable storage medium with a set of instructions stored thereon that when executed by a processor resource causes the memory controller to, in accordance with a schedule based on the patrol scrub period, cause scrub operations to perform at memory locations of the memory module 202 (e.g., a RAM module). The ECC 210 is depicted as on-die ECC available on each memory chip 236 (also discussed herein as a die or an integrated circuit, such as integrated circuit 336 in FIG. 3) of the memory module 202.

The PMU 212 is a coordinator over the battery 208. For example, the PMU may be a controller (e.g. microcontroller) that governs the power functions of a compute device and may comprise timers to measure intervals of time as well as analog to digital converters to measure the voltages of the power source (e.g., the main battery) of the computer.

A PMU may maintain the attributes of the battery. Example attributes of the battery include a power connection attribute and a battery level attribute. A power connection attribute represents whether the system is operationally connected to an external power source. A battery level attribute represents the level of charge available by the energy storage device. The PMU may represent the attributes of the battery using identifiers (i.e., any appropriate value, number, character, string, or categorization capable of representing an attribute or attributes). For example, the power connection attribute may be a label representing an identification as to whether the battery-based system is connected to an external power source and the battery level attribute may be a percentage to represent a value of a charge of the energy storage device of the battery-based system.

FIG. 2 depicts the example system 200 may comprise a memory resource 220 operatively coupled to a processor resource 222. The processor resource 222 may be operatively coupled to the memory controller 204 and the PMU 212. The combination of the processor resource 222 and the memory resource 220 may implement a BIOS, for example, to coordinate programming the patrol scrub period, as depicted in FIG. 3. For another example, the memory resource 220 and/or the processor resource 222 may be implemented on a semiconductor, such as part of a controller to perform operations that are logically implemented on silicon.

Referring to FIG. 2, the memory resource 220 may contain a set of instructions that are executable by the processor resource 222. The set of instructions are operable to cause the processor resource 222 to perform operations of the system 200 when the set of instructions are executed by the processor resource 222. The set of instructions stored on the memory resource 220 may be represented as retrieval program code 224 and schedule program code 226. The processor resource 222 may carry out a set of instructions to execute the retrieval program code 224, the schedule program code 226, and/or any other appropriate operations among and/or associated with the components of the system 200. For example, the processor resource 222 may carry out a set of instructions to operate as a control program interface with the functionality to retrieve the power status of a compute device (such as retrieve the power status 206 of the battery 208 from the PMU 212) and maintain a patrol scrub period in which to scrub a plurality of addresses of a memory module (e.g., a DDR RAM module) based on the retrieved power status of the battery 208. For another example, the processor resource 222 may carry out a set of instructions to determine whether the power status 206 indicates the energy storage device (e.g., battery 208) is charging or discharging, set the programmable patrol scrub period to a first duration when the power status indicates the energy storage device is charging, and set the programmable patrol scrub period to a second duration (e.g., a time period that is longer than the first duration) when the power status indicates the energy storage device is discharging. For yet another example, the processor resource 222 may carry out a set of instructions to determine a charge amount of the energy storage device (e.g., identify the charge level of the battery 208 via a request to the PMU 212) and calculate the programmable patrol scrub period based on a function defined by an inversely proportional relationship between the programmable patrol scrub period and the charge amount. As used herein, a control program interface represents a system to operate the control programs that interface with the circuitry of a compute device, such as a BIOS or a unified extensible firmware interface (UEFI).

Although these particular modules and various other modules are illustrated and discussed in relation to FIG. 2 and other example implementations, other combinations or sub-combinations of modules may be included within other implementations. Said differently, although the modules illustrated in FIG. 2 and discussed in other example implementations perform specific functionalities in the examples discussed herein, these and other functionalities may be accomplished, implemented, or realized at different modules or at combinations of modules. For example, two or more modules illustrated and/or discussed as separate may be combined into a module that performs the functionalities discussed in relation to the two modules. As another example, functionalities performed at one module as discussed in relation to these examples may be performed at a different module or different modules. FIG. 4 depicts yet another example of how functionality may be organized into modules.

A processor resource is any appropriate circuitry capable of processing (e.g., computing). Instructions, such as one or multiple processing elements capable of retrieving instructions from a memory resource and executing those instructions. For example, the processor resource 222 may be a central processing unit (CPU) that enables patrol scrubbing a memory module by fetching, decoding, and executing instructions 224 and 226. Example processor resources include at least one CPU, a semiconductor-based microprocessor, a programmable logic device (PLD), and the like. Example PLDs include an application specific integrated circuit (ASIC), a field-programmable gate array (FPGA), a programmable array logic (PAL), a complex programmable logic device (CPLD), and an erasable programmable logic device (EPLD). A processor resource may include multiple processing elements that are integrated in a single device or distributed across devices. A processor resource may process the instructions serially, concurrently, or in partial concurrence.

A memory resource represents a medium to store data utilized and/or produced by the system for patrol scrubbing the memory module. The medium is any non-transitory medium or combination of non-transitory media able to electronically store data, such as instructions (e.g., program codes 224 and 226) of the system and/or data used by the system. For example, the medium may be a storage medium, which is distinct from a transitory transmission medium, such as a signal. The medium may be machine-readable, such as computer-readable. The medium may be an electronic, magnetic, optical, or other physical storage device that is capable of containing (i.e., storing) executable instructions. The memory resource 220 may be said to store program instructions that when executed by the processor resource 222 cause the processor resource 222 to implement functionality of the system 200 of FIG. 2. A memory resource may be integrated in the same device as the processor resource or it may be separate but accessible to that device and the processor resource. The memory resource may be distributed across devices.

Components of the systems 100 and 200 have been described as circuitry or a combination of circuitry and executable instructions and may be implemented in a number of fashions. Looking at FIG. 2, the executable instructions may be processor-executable instructions, such as program instructions, stored on the memory resource 220, which is a tangible, non-transitory computer-readable storage medium, and the circuitry may be electronic circuitry, such as processor resource 222, for executing those instructions. The instructions residing on the memory resource 220 may comprise any set of instructions to be executed directly (such as machine code) or indirectly (such as a script) by the processor resource 222.

In some examples, the system 200 may include the executable instructions may be part of an installation package that when installed may be executed by the processor resource 222 to perform operations of the system 200, such as methods described with regards to FIGS. 4-6. In that example, the memory resource 220 may be a portable medium such as a compact disc, a digital video disc, a flash drive, or memory maintained by a server device from which the installation package may be downloaded and installed. In another example, the executable instructions may be part of an application or applications already installed. The memory resource 220 may be a non-volatile memory resource such as read only memory (ROM), a volatile memory resource such as random access memory (RAM), a storage device, or a combination thereof. Example forms of a memory resource 220 include static RAM (SRAM), dynamic RAM (DRAM), electrically erasable programmable ROM (EEPROM), flash memory, or the like. The memory resource 220 may include integrated memory such as a hard drive (HD), a solid state drive (SSD), or an optical drive.

FIG. 3 depicts an example mobile compute device 300. The example mobile compute device 300 comprises a system similar to the system 200 of FIG. 2. In general, the example mobile compute device 300 comprises a battery 308, a BIOS 334, a memory controller 304, and a RAM 302, where the descriptions of battery 208, memory controller 204, and memory module 202 are applicable to the battery 308, the memory controller 304, and the RAM 302, respectively, and are not repeated for brevity. The mobile device 300 may also contain a PMU 312 to assist in retrieving the power status from the battery 308 or otherwise maintaining the power capabilities of the mobile compute device 300.

The BIOS 334 comprises a combination of circuitry and executable instructions implemented as processor resource 322 and a memory resource 320 containing retrieval program code 324 and schedule program code 326 that are the same as retrieval program code 224 and schedule program code 226 of FIG. 2 respectively. The memory controller 304 comprises a combination of circuitry and executable instructions implemented as processor resource 332 and memory resource 330 containing scrub program code 328 that is the same as scrub program code 228 of FIG. 2.

The memory module of the mobile compute device 300 is a RAM module 302. The RAM module 302 comprises a plurality of integrated circuits 336 (e.g., chips). Each of the plurality of integrated circuits 336 contain ECC 310 stored thereon. In this manner, the RAM module 302 does not have an extra integrated circuit dedicated to the ECC.

Referring to FIG. 3, the instructions of the system (e.g., program codes 324, 326, and 328) may be distributed across devices (e.g., across the BIOS 334, the memory controller 304, and the memory module 302), unless described otherwise herein. The instructions, when executed, may complete or assist completion of operations performed in describing another set of instructions. Thus, although the various engines and modules are shown as separate sets of instructions in FIGS. 2 and 3, in other implementations, the functionality of multiple sets of instructions may be implemented as a single set of instructions or divided in a variety of sets of instructions. In some example, the systems 100, 200, and/or 300 may perform example methods described in connection with FIGS. 4-6.

FIG. 4 depicts example operations used to implement example systems for patrol scrubbing a memory module. Referring to FIG. 4, the example program code sets of FIG. 4 generally include retrieval program code 434, schedule program code 436, and scrub program code 438. The example program code sets of FIG. 4 may be implemented on a compute device, such as mobile compute device 300 of FIG. 3.

Upon an event 454 (such as a disconnection from an external power source or a request from a BIOS), the retrieval program code 434 may be executed by a processor resource. The retrieval program code 434 may include program code, such as PMU access program code 440 and status program code 442, to assist in retrieving the power status of an energy storage device. The PMU access program code 440 represents instructions that when executed by a processor resource cause the processor resource to access a PMU associated with the energy storage device and retrieve attributes 456 of the energy storage device. The status program code 442 represents instructions that when executed by a processor resource cause the processor resource to identify the power status 458 of the energy storage device based on the attributes 456. The power status 458 may comprise the attributes 456.

The power status 458 is provided by a processor resource executing the retrieval program code 434 to a processor resource executing the schedule program code 436. The schedule program code 436 represents instructions that when executed identify the time period 460 (e.g., patrol scrub period) to set for the patrol scrub on an on-die ECC memory module. The schedule program code 436 may include program code, such as a calculation program code 444 and a settings program code 446, to assist in setting the patrol scrub period. The calculation program code 444 represents instructions that when executed by a processor resource cause the processor resource to determine the patrol scrub period based on the power status 458. For example, a processor resource executing the calculation program code 444 may determine the patrol scrub period by dividing a maximum scrub time (e.g., 72 hours) by a charge factor based on a remaining charge percentage provided by the power status 458 or otherwise indicated by the power status 458. A charge factor, as used herein, represents a numerical value to modify the predetermined scrub time based on amount of charge of an energy storage device where the numerical value is based on an inverse relationship between the charge amount and the patrol scrub period. For example, a battery at 75% charge could be represented as a factor of one quarter to calculate one quarter of the maximum scrub period as the patrol scrub period the maximum scrub period while a battery at 25% charge could be represented as a factor of three quarters to calculate three quarters of the maximum scrub period as the patrol scrub period. The settings program code 446 represents instructions that when executed by a processor resource cause a processor resource to call a function to cause the memory controller to set the patrol scrub period of an on-die ECC memory module to the patrol scrub period determined by the processor resource executing the calculation program code 444.

The scrub program code 438 may contain instructions (such as interval program code 448, address program code 450, and track program code 452) to assist in performing a patrol scrub on a memory module. The interval program code 448 represents instructions that when executed by a processor resource cause the processor resource to identify a schedule (e.g., a rate of scrubbing address) to scrub the addressable locations of the memory module based on the time period 460. The schedule may be, for example, the time period 460 divided by the number of addressable memory locations of the memory module. The address program code 450 represents instructions that when executed by a processor resource cause the processor resource to identify a memory location 462 to perform a scrub based on the time period 460 (e.g., the next memory location based on the determined schedule). The track program code 452 represents program instructions that when executed by a processor resource cause the processor resource to track the memory locations that are scrubbed during the patrol scrub period. In this manner, as the patrol scrub period changes based on the amount of charge of the energy storage device, for example, the on-die ECC memory module may continue to perform scrub operations in the predetermined order at the updated rate based on the updated power status. The result of executing the scrub program code 438 may be a memory access operation at the memory location 462 and may result in a memory access request 464 and a scrub operation being performed at the memory location 462. The ECC of an on-die ECC memory module may comprise the scrub program code 438.

FIGS. 5 and 6 are flow diagrams depicting example methods for patrol scrubbing a memory module. Referring to FIG. 5, example methods for patrol scrubbing a memory module may generally comprise retrieving a power status of an energy storage device, setting a patrol scrub period based on the power status, identifying a memory location, causing a scrub operation at the memory location, and causing the on-die ECC to execute during the scrub operation. The example method for patrol scrubbing a memory module as described herein is performable on a system for patrol scrubbing a memory module with on-die ECC of a battery-based computer system that includes a memory controller that does not support memory modules with an extra ECC memory chip. Example systems that may use the example method include the systems 100, 200, and 300 of FIGS. 1, 2, and 3, respectively.

At block 502, a power status of a battery of a battery-based computer system is retrieved, such as by a power status retrieval operation via a BIOS of the battery-based system. For example, the operation(s) at block 502 may be performed by a system comprising retrieval program code, such as retrieval program code 224 of FIG. 2 or the BIOS 334 of FIG. 3, either directly or indirectly. The power status retrieval operation may provide the power status based on the attributes of the battery, such as attributes identifiable and maintained by a PMU.

At block 504, a patrol scrub period is set based on the power status. The patrol scrub period may be set in response to a determination that the battery is discharging, such as on an event cause by a disconnection of an external power source. A BIOS, such as a BIOS of FIG. 3, may perform the determination of the battery discharge state, the calculation of patrol scrub period, and the setting of the patrol scrub period, such as by causing execution of program code, such as program code identified with respect to schedule program code 436 of FIG. 4. The BIOS may use function calls to the PMU, the memory controller, or other management subsystems of the battery-based computer system to cause performance of the operations described herein (e.g., the BIOS may indirectly perform the operations by causing the operations to be performed by a particular subsystem).

At block 506, a memory location of a memory module, such as memory module 102 of FIG. 1, is caused to be identified as to be scrubbed during the patrol scrub period. For example, the BIOS may program the memory controller based on a function call at block 504, and the memory controller, in response to the change in patrol scrub period, determines an updated patrol scrub schedule based on the patrol scrub period and utilizes the schedule to identify the next addressable memory location on which to perform a scrub operation. For example, the memory controller may track the order for performing the sequential scrub operations and make a scrub request to the memory module with the memory location as a parameter. For another example, the memory module may sequentially walk through the addressable memory locations every time a request is made from the memory controller, incrementing to the next address in the sequential order when a scrub request is received and resetting to the first location (e.g, location zero) when exceeding the addressable memory range. In that example, the controller may perform patrol scrubbing requests without the overhead of tracking the memory locations to determine the next memory location to scrub.

At block 508, a scrub operation is caused to be performed at the memory location based on the schedule derived from the patrol scrub period at block 504. The scrub operation may comprise a read operation at the memory location where the read operation provides data processed using the on-die ECC as discussed with regards to block 510. The scrub operation may be performed during or in response to a determination that the value at the memory location contains an error. At block 510, ECC is caused to execute by the memory module during the scrub operation. For example, a plurality of memory chips of the memory module may be caused to execute the on-die ECC during the scrub operation at the memory location. The BIOS, such as the BIOS 334 of FIG. 3, and/or the memory module, such as memory module 102 of FIG. 1, may perform the operation(s) associated with blocks 506 and 508, either directly or indirectly.

FIG. 6 includes blocks similar to blocks of FIG. 5 and provides additional blocks and details. In particular, FIG. 6 depicts additional blocks and details generally regarding determining a patrol scrub period and reading all the locations of a memory module. Blocks 602, 612, 616, 618, and 620 are the same as blocks 502, 504, 506, 508, and 510 of FIG. 5 and, for brevity, their respective descriptions are not repeated.

At block 604, a patrol scrub period is determined based on the power status where the power status comprises a power connection attribute and a battery level attribute. For example, a BIOS, such as a BIOS 334 of FIG. 3 may determine the patrol scrub period based on an identification as to whether the battery-based system is connected to an external power source and a value of a charge of the battery-based system. In that example, the power connection attribute represents the identification as to whether the battery-based system is operatively connected to an external power source and the battery level attribute represents the value of a charge of the battery-based system, such as a percentage or a category representing a range of charge amounts.

The patrol scrub period may be determined based on an inversely proportional relationship with a charge level of the battery-based system. For example, the calculation program code 444 of FIG. 4 may comprise a function where the resulting patrol scrub period increases as the battery-level, provided as input to the function, decreases. In this manner, the patrol scrub period may be extended to, for example, reduce power consumption on a mobile compute device that is discharging power from the energy storage device. The patrol scrub period may be determined based on charge level categories derived from predetermined charge amount levels. For example, the patrol scrub period may have three ranges of charge amounts, a first category for a first range of charge amounts above 66%, a second category for a second range from 33% to 66%, and a third category for a third range of charge amounts less than 33%.

An example method for determining a patrol scrub period based on an inversely proportional relationship with a charge level is depicted by blocks 606, 608 and 610. At block 606, the charge level of the battery-based system is identified. At block 608, a charge category associated with the charge level range that includes the charge level. At block 610, a patrol scrub period associated with the charge category is selected. For example, a charge level of 45% may be identified at block 606, where the charge category associated with a range from 33% to 66% is identified at block 608, and a patrol scrub period of 24 hours is selected based on the charge category, such as when there is a first category associated with 12 hours, a second category associated with 24 hours, and a third category associated with 48 hours.

At block 614, all locations of the memory module are read within the patrol scrub period. The memory module may have ECC that iteratively scrubs each addressable memory location of the memory module. The rate at which the memory locations are scrubbed may be based on a schedule which is based on the power status of the energy storage device of the compute system. The memory module, such as based on a combination of circuitry and executable instructions (e.g., scrub program code), may iteratively identify a memory location at block 616, perform a scrub operation 618, and execute ECC during the scrub operation at block 620 (e.g., detect an error and send a corrected value if an error is detected). These iterations may be caused by setting the patrol scrub period. For example, the memory controller and/or the memory module may be programmed to sequentially walk, at a rate based on the patrol scrub period, through the cache line to read the values, perform scrub operations if errors are detected, and may send the correct bits to the memory controller.

At block 622, memory locations may be caused to be tracked. Memory locations scrubbed during a time frame based on the patrol scrub period may be tracked to allow for proper patrol scrub performance, for example. The operation(s) performed at block 622 may be performed by a processor executing the track program code 452 of FIG. 4, for example. The tracking of memory locations may allow for patrol scrubbing to continue at the same point in the scrub performance order when the patrol scrub period is changed. For example, the memory controller and/or the memory module may be programmed to sequentially walk through the cache line and when the patrol scrub period is changed, the memory module continues the scrub operations at the point in the sequential cache line when the change happened. In this manner, the order in which the addressable memory locations are scrubbed is maintained while the time difference between each scrub may change according to any changes in the patrol scrub period. As the patrol scrub period is programmed to a longer period, the power consumption due to the patrol scrub operations may reduce and, in turn, provide longer battery life for the battery-based computer system, for example.

Although the flow diagrams of FIGS. 4-6 illustrate specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present description.

All of the features disclosed in this specification (including any accompanying claims, abstract and drawings), and/or all of the elements of any method or process so disclosed, may be combined in any combination, except combinations where at least some of such features and/or elements are mutually exclusive.

The present description has been shown and described with reference to the foregoing examples. It is understood, however, that other forms, details, and examples may be made without departing from the spirit and scope of the following claims. The use of the words "first," "second," or related terms in the claims are not used to limit the claim elements to an order or location, but are merely used to distinguish separate claim elements.

What is claimed is:

1. A system comprising:
an energy storage device to provide power to the system;
a memory module with on-die error correction code (ECC) that, when executed, causes the memory module to perform error correction operations comprising a scrub operation; and
a memory controller to:
retrieve a level of charge of the energy storage device;
set a programmable patrol scrub period inversely proportional to the level of charge of the energy storage device; and
cause the error correction operations to perform during a scrub routine with the programmable patrol scrub period, the memory controller lacks an error tracking feature and is to operate independent of a correction performable by the on-die ECC.

2. The system of claim 1, wherein:
the memory controller is unaware of which memory locations of the memory module are corrected by the on-die ECC on the memory module.

3. The system of claim 1, wherein the energy storage device is a battery, a capacitor, or a combination thereof.

4. The system of claim 1, wherein the memory controller includes: a computer-readable storage medium comprising a set of instructions executable by a processor resource to retrieve the level of charge by a control program interface operation.

5. The system of claim 4, wherein the set of executable instructions is further to:
determine whether the level of charge indicates the energy storage device is charging or discharging;
set the programmable patrol scrub period to a first duration when the level of charge indicates the energy storage device is charging; and
set the programmable patrol scrub period to a second duration when the level of charge indicates the energy storage device is discharging, the second duration to be longer than the first duration.

6. A mobile compute device comprising:
a battery;
a random access memory (RAM) module comprising a plurality of integrated circuits, each of the plurality of integrated circuits containing error correction code (ECC) stored thereon;
a first computer-readable storage medium with a first set of instructions stored thereon that when executed by a first processor resource causes the first processor resource to:
retrieve a level of charge of the battery;
set a programmable patrol scrub period inversely proportional to the level of charge of the battery;
maintain, based on the set patrol scrub period in which to scrub a plurality of addresses of the RAM module; and
a correction-transparent memory controller comprising a second computer readable storage medium with a second set of instructions stored thereon that when executed by a second processor resource causes the memory controller to:
track the memory locations that are scrubbed during the patrol scrub period; and
cause performance of scrub operations to memory locations of the RAM module in accordance with the schedule based on the patrol scrub period, wherein the scrub operations comprise a read operation that causes the RAM module to provide a correct value based on error correction operations defined by the ECC.

7. The device of claim 6, comprising:
a power management unit (PMU) that maintains attributes of the battery, wherein the first set of instructions includes a power status retrieval operation that provides the power status based on the attributes identifiable by the PMU.

8. The device of claim 6, wherein the first set of instructions is executable by the processor resource to:
determine the patrol scrub period by dividing a maximum scrub time by a charge factor based on a remaining charge percentage.

9. The device of claim 6, wherein the first set of instructions is executable by the first processor resource to:
maintain a time difference between each scrub operation in response to changes in the patrol scrub period.

10. A method for patrol scrubbing a memory module with on-die error correction code (ECC) of a battery-based computer system including a memory controller that does not support memory modules with an extra ECC memory chip, the method comprising:
retrieving, via a unified extensible firmware interface (UEFI), a level of charge of a battery of the battery-based computer system;
setting, in response to a determination that the battery is discharging, by the UEFI via the memory controller, a patrol scrub period based on the level of charge of the battery of the battery-based computer system;

identifying a memory location of the memory module that is to be scrubbed during the patrol scrub period;

causing, by the memory module, a scrub operation to perform at the memory location based on a schedule derived from the patrol scrub period that is inversely proportional to the level of charge of the battery of the battery-based computer system, the scrub operation comprising a read operation at the memory location that provides data processed using the on-die ECC;

causing, by a plurality of memory chips on the memory module, the on-die ECC to execute during the scrub operation at the memory location;

causing memory locations to be tracked and scrubbed during a time frame based on the patrol scrub period; and reading all locations of the memory module within the patrol scrub period.

11. The method of claim 10, comprising:
determining the patrol scrub period based on:
an identification as to whether the battery-based system is connected to an external power source; and
a value of a charge of the battery-based system, wherein the level of charge of the battery comprises a power connection attribute that represents the identification and a
battery level attribute that represents the value.

12. The method of claim 10, comprising:
identifying the charge level of the battery-based system;
identifying a charge category associated with a charge level range that includes the charge level; and
selecting the patrol scrub period associated with the charge category.

13. The method of claim 10, comprising:
setting the patrol scrub period using a calculation program code and a settings program code.

14. The method of claim 13, comprising:
determining the patrol scrub period based on the calculation program code that includes dividing a threshold scrub time by a charge factor.

15. The method of claim 10 comprising:
identifying a scrub schedule to scrub addressable locations of a memory module based on a time period.

* * * * *

UNITED STATES PATENT AND TRADEMARK OFFICE
CERTIFICATE OF CORRECTION

PATENT NO. : 10,521,294 B2
APPLICATION NO. : 15/563094
DATED : December 31, 2019
INVENTOR(S) : Reza M Bacchus It is certified that error appears in the above-identified patent and that said Letters Patent is hereby corrected as shown below:

In Column 14, Line 29, Claim 6, delete "computer readable" and insert -- computer-readable --, therefor.

Signed and Sealed this
Tenth Day of March, 2020

Andrei Iancu
*Director of the United States Patent and Trademark Office*